(12) United States Patent
Murphy

(10) Patent No.: US 6,621,442 B1
(45) Date of Patent: Sep. 16, 2003

(54) ANALOG-TO-DIGITAL CONVERSION WITH PIECE-WISE NON-LINEAR REFERENCE WAVEFORMS

(76) Inventor: Charles Douglas Murphy, 601 Linden Pl. #210, Evanston, IL (US) 60202

(*) Notice: Subject to any disclaimer, the term of this patent is extended or adjusted under 35 U.S.C. 154(b) by 0 days.

(21) Appl. No.: 10/179,937

(22) Filed: Jun. 24, 2002

(51) Int. Cl.[7] ................................. H03M 1/12
(52) U.S. Cl. ................. 341/155; 341/156; 341/169; 341/120; 341/146
(58) Field of Search ................. 341/155, 169, 341/147, 116, 143, 138, 120, 156, 139, 146

(56) References Cited

U.S. PATENT DOCUMENTS

| | | | |
|---|---|---|---|
| 3,683,369 A | * | 8/1972 | Stern .................. 341/169 |
| 4,075,577 A | | 2/1978 | Walker |
| 4,217,574 A | | 8/1980 | Anderson |
| 4,350,974 A | | 9/1982 | Gordon et al. |
| 4,368,432 A | * | 1/1983 | Levy .................. 341/147 |
| 4,800,574 A | | 1/1989 | Tanaka et al. |
| 4,983,973 A | | 1/1991 | Lewyn |
| 5,101,206 A | | 3/1992 | Riedel |
| 5,196,851 A | | 3/1993 | Patel et al. |
| 5,266,951 A | | 11/1993 | Kuegler et al. |
| 5,321,403 A | | 6/1994 | Eng, Jr. et al. |
| 5,325,314 A | * | 6/1994 | Lippmann et al. ......... 341/170 |
| 5,396,247 A | | 3/1995 | Watanabe et al. |
| 5,402,125 A | | 3/1995 | Distinti |
| 5,594,612 A | | 1/1997 | Henrion |
| 6,049,298 A | | 4/2000 | Knudsen |
| 6,195,031 B1 | | 2/2001 | Feld et al. |
| 6,225,928 B1 | | 5/2001 | Green |
| 6,301,312 B1 | | 10/2001 | Limberg |
| 6,384,760 B1 | | 5/2002 | Fuhrman |

OTHER PUBLICATIONS

Paul Horowitz & Winfield Hill, *The Art of Electronics*, 2nd Ed. 1994, pp. 613, 614, 621–641, Cambridge University Press, New York.
*A 20–Bit (1 ppm) Linear Slope–Integrating A/D Converter*, National Semiconductor Application Note 260 Jan. 1981; published ©1995. pp. 1–8.

* cited by examiner

*Primary Examiner*—Michael Tokar
*Assistant Examiner*—Lam T. Mai

(57) ABSTRACT

A machine used for analog-to-digital (A/D) conversion in which an analog input is compared to a piece-wise non-linear analog reference waveform. A digital count is recorded indicative of when the difference between the two becomes zero. Alternative mappings such a linear correspondence between analog input values and digital output values can be implemented via digital processing of each recorded count. The invention is particularly intended for use with sinusoidal reference waveforms to enable low-cost, high-precision A/D conversion at speeds much higher than are possible with piece-wise linear analog reference waveforms such as saw-tooth or triangle waveforms. The invention can be implemented with multiple A/D converters sharing a piece-wise non-linear analog reference waveform, with conversion cycles using increasing or decreasing waveform segments, and with compensation of comparator-induced errors.

36 Claims, 1 Drawing Sheet

ANALOG-TO-DIGITAL CONVERSION WITH PIECE-WISE NON-LINEAR REFERENCE WAVEFORMS

CROSS-REFERENCE TO RELATED APPLICATIONS

Figure 1:
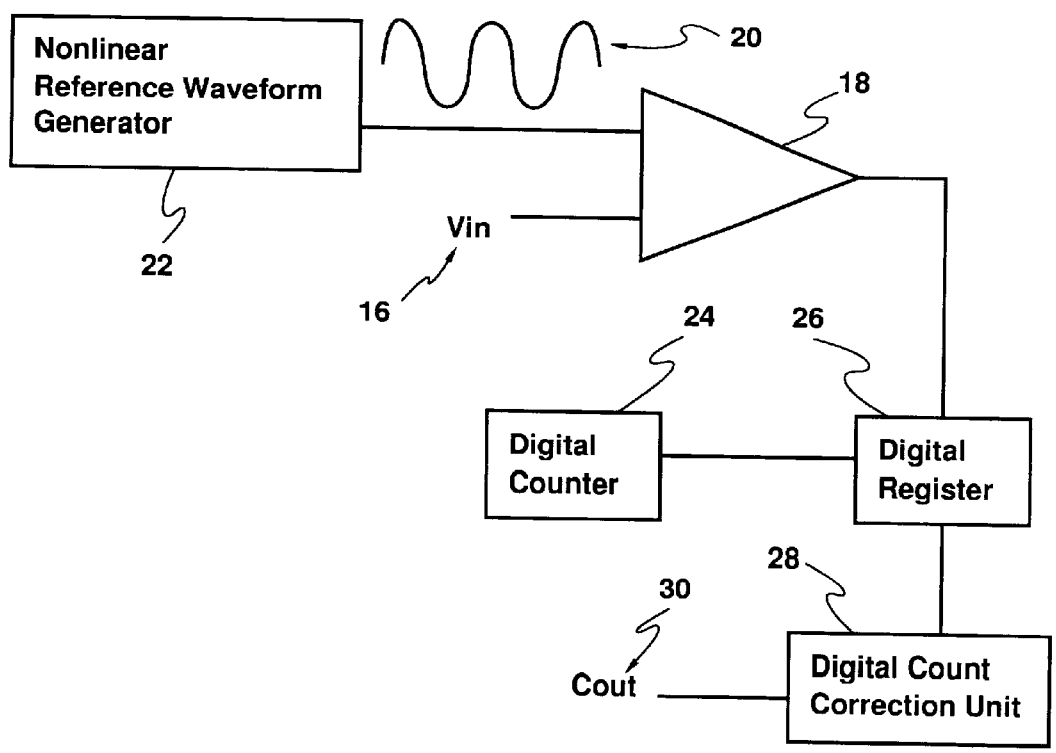

The invention is related to OFFSET-COMPENSATED SHARED PARALLEL ANALOG-TO-DIGITAL CONVERSION submitted as a separate application to the US PTO by the applicant of the present invention.

STATEMENT REGARDING FEDERALLY SPONSORED RESEARCH OR DEVELOPMENT

Not applicable

REFERENCE TO A MICROFICHE APPENDIX

Not applicable

BACKGROUND

1. Field of Invention

The invention relates to analog-to-digital (A/D) conversion via comparison of an analog input to a reference analog waveform, particularly to low-cost techniques using certain kinds of high-frequency non-linear waveforms such as sinusoidal waveforms.

2. Description of Prior Art

An analog-to-digital (A/D) converter provides a digital number as output given an analog input. Usually, there is a linear mapping between a partitioned range of allowed analog input values and an ordered set of allowed digital output values. The size of each bin in the partition depends on the total range of allowed analog input values and on the precision of the converter. Precision is often measured in terms of bits. High precision converters generally have much smaller bin sizes than low precision converters.

Speed is another important A/D converter feature. In a non-pipelined A/D converter, the conversion speed is the reciprocal of the total time required per conversion. High-speed converters are desirable in many applications. For instance, a high-speed A/D converter may allow digital processing at relatively high intermediate frequencies in communications systems such as wireless networks. As another example, a high-speed A/D converter might be used for A/D conversion of large numbers of sensor outputs in a digital still or video imaging system.

A difficulty with prior art A/D converters is that low-precision, high-speed A/D converters and high-precision, low-speed A/D converters have reasonable implementation cost, while high-speed, high-precision A/D converters do not.

Flash A/D converters are the fastest available. A flash converter has a set of comparators which simultaneously compare an analog input to a set of reference signals. The number of comparators grows exponentially with the number of bits of precision. Flash converters are typically limited to 8 to 10 bits of precision, at which point their component count becomes prohibitively large.

Another shortcoming of flash converters at 10 or more bits of precision is difficulty in matching the performance characteristics of the comparators. The bin sizes become small enough that such effects as comparator input offset voltage lead to missing codes—i.e. to digital outputs that can never occur—and to other unwanted distortions.

An alternative to flash conversion uses the basic technique of successive approximation (SA). In an SA A/D converter, a sequence of possible digital outputs is generated. Each sequence member is converted to an analog value, which is compared to an analog input. The comparison result is used to select a next member of the sequence.

The time required for SA A/D conversion increases at least linearly with the precision. While an SA A/D converter can be implemented as a pipeline in order to increase the conversion rate, the speed of each pipelined stage is still limited by the time required for settling of the digital-to-analog (D/A) converter which provides the analog reference signal corresponding to each selected possible digital output. SA A/D converters are often implemented with between 12 and 16 bits of precision.

For converters with very high precision—between 16 and 22 bits—techniques such as charge-balancing or multi-slope integration are used. In a charge-balancing converter, small packets of charge placed on a capacitor are selectively switched into a summing junction. A counter keeps track of the total number of charge packets switched into the summing junction during one conversion cycle, with the final count being the digital output. Charge-balancing techniques suffer from a long conversion cycle and are not amenable to shared parallel implementations.

Single-slope and dual-slope integration techniques are discussed in the second edition of THE ART OF ELECTRONICS by Paul Horowitz and Winfield Hill, with multi-slope integration techniques appearing in other prior art. The basic idea of these techniques is to generate analog reference waveforms made up of linear waveform segments, with the linear segments mapped to digital count sequences for an overall linear mapping between the range of allowed analog input values and the set of allowed digital output values.

For each linear segment, the time required for the difference between an unknown analog input level and a known reference signal to reach zero can be measured as a digital number representative of the unknown analog input. The linear segments can be reference ramp segments with a known slope, or can be input ramp segments with unknown slope. Reference ramp segments are desirable in the case of shared parallel A/D converters, as discussed in OFFSET-COMPENSATED SHARED PARALLEL ANALOG-TO-DIGITAL CONVERSION by the inventor of the present invention. In some multi-slope integrating A/D converters, signals can be selectively offset, so that, for instance, a ramp segment need not be generated over the full range of analog input values.

A linear ramp segment can be generated in an integrating A/D converter by charging or discharging a capacitor of known capacitance with a known constant current. The slope may be in error by a sufficient amount to cause unwanted distortion if the capacitance value or the current value are not known with sufficient precision. Such distortion can be corrected by taking ratios of multiple measurements to normalize with respect to unknown and/or slowly time-varying slope errors.

Another problem with generating a linear ramp segment with a constant current across a capacitor is dielectric absorption. Dielectric absorption—described in THE ART OF ELECTRONICS and in other prior art—occurs because the dielectric material between the plates of a capacitor is not a perfect insulator. The effects of the imperfection can be modeled by a parasitic capacitor and resistor connected in series with each other but in parallel with the desired ideal capacitor. Dielectric absorption depends on the charge stored on the ideal and parasitic portions of a capacitor, on the ideal and parasitic component values, and on the current flowing through the capacitor.

Dielectric absorption is principally a problem after changes in current flow. For instance, when a constant current is switched on to commence generation of a ramp segment, there is a transition period during which the actual voltage across the capacitor is a highly non-linear function of the constant current. After the transition period the voltage settles down and has a slope that is asymptotically linear.

Dielectric absorption creates a time window and a voltage range over which the result of the constant current is not a ramp segment of suitably accurate linearity. Dielectric absorption also results in a slope error in the steady state. The time window duration and the wasted voltage range depend on the values of the parasitic components, on the ideal capacitance, on the constant current value, and on the desired converter precision. For high-precision slope-based A/D converters, the charging current is usually small, resulting in a ramp of long duration. A long time window is allowed for the transition in exchange for a small wasted voltage range. The slope error can be corrected simultaneously with the slope error due to ideal capacitor or constant current value errors, as described in National Semiconductor Application Note 260, entitled A 20-BIT (1PPM) LINEAR SLOPE-INTEGRATING A/D CONVERTER.

The clear result of a ramp segment of long duration is a long A/D conversion time for each converted input. Including further time for full charging or discharging of the integrating capacitor prior to initiating ramp segment generation further decreases the conversion rate.

SUMMARY

The present invention enables low-cost, high-precision, high-speed A/D converters using reference waveforms that are not piecewise linear, particularly sinusoidal waveforms. A desired linear mapping of analog inputs to digital outputs and compensation of slope errors and comparator input offset effects can be generated via digital processing of measured digital count values.

OBJECTS AND OBJECTIVES

There are several objects and objectives of the present invention.

It is an object of the present invention to provide a novel A/D conversion technique based on piece-wise non-linear reference waveforms.

It is an object of the present invention to provide a novel A/D conversion technique that can exploit the wide body of prior art for generating sinusoids, which hitherto have been used mainly for communication systems.

It is an object of the present invention to provide a novel high-speed A/D conversion technique which uses sinusoids of relatively low frequency.

It is an object of the present invention to eliminate the deleterious effects of dielectric absorption, particularly by generating reference waveforms that are eigenfunctions of passive components such as capacitors.

It is an object of the present invention to allow high-speed, high-precision A/D converters with shared reference waveforms.

Further objects and advantages of the invention will become apparent from a consideration of the ensuing description.

DRAWING FIGURES

In the drawings, closely related figures have the same number but different alphabetic suffixes.

FIG. 1 shows a block diagram of a preferred embodiment of the present invention.

REFERENCE NUMERALS IN DRAWINGS

16 an analog input
18 a comparator
20 a sinusoidal reference waveform
22 a piece-wise non-linear reference waveform generator
24 a first counter
26 a register
28 a digital count correction unit
30 a first corrected digital output

DESCRIPTION—THE PREFERRED EMBODIMENT OF THE INVENTION

The preferred embodiment of the invention is shown in the form of a block diagram in FIG. 1. An analog input 16 is supplied to one input of a comparator 18. A sinusoidal reference waveform 20 is supplied by a piece-wise non-linear reference waveform generator 22 to the other input of comparator 18. During a first conversion cycle, comparator 18 compares the value of analog input 16 to the value of sinusoidal reference waveform 20, while a first counter 24 provides a first count sequence. If and when the output of comparator 18 changes during the first conversion cycle, a first count value is stored in register 26.

The first recorded count value indicates the time required for the value of sinusoidal reference waveform 20 to reach the value of analog input 16. The first recorded count value is passed to digital count correction unit 28, which provides a first corrected digital output 30. Digital count correction unit 28 exploits knowledge of sinusoidal reference waveform 20 in correcting the first recorded count value. A sinusoid can be defined by a set of parameters including a frequency, phase and level offsets relative to a reference origin, and an amplitude.

Techniques and technologies for generating precision sinusoids are numerous and well-developed in the prior art. Sinusoidal reference signals have been used for more than a century in communications systems to shift up (or modulate) and to shift down (or demodulate) relatively low-frequency base-band signals that are transmitted and received at relatively high frequencies. Circuits such as phase-locked loops can be used to precisely control the frequency and phase of sinusoids. Preferably, non-linear reference waveform generator 22 includes circuitry which ensures that both the frequency and the phase of sinusoidal reference waveform 20 are precisely controlled.

From the perspective of A/D conversion, precise control of sinusoid frequency and phase means that different conversion cycles can be provided with nearly identical piece-wise non-linear analog reference waveform segments. This is useful in embodiments of the present invention where it is desired to compensate for phase offsets, level offsets, and amplitude offsets in the sinusoidal reference waveform and also to compensate for comparator effects such as comparator input offset voltage.

Modern communications systems operate at very high frequencies. For instance, mobile phone networks use radio spectrum bands in the vicinity of 900 MHz or 1.8 GHz (1800

MHz), while some cordless phones operate in the vicinity of 2.4 GHz. In contrast, an A/D converter might provide ten thousand, one hundred thousand, or even ten million conversions per second. High speeds for A/D converters correspond to very low or modest sinusoid frequencies. Using approximately the full range of a sinusoid's amplitude variation for a single conversion, during one period of a sinusoidal waveform it is possible to implement two serial A/D conversions. Thus the A/D converter rates cited above might require only 5 kHz, 50 kHz, or 5 MHz sinusoids.

With input-multiplexed parallel A/D converter implementations, lower frequencies can allow the same overall conversion rate. Such parallel A/D converters can share a digital counter, a reference waveform, and digital correction circuitry, and so may have quite low marginal cost.

A key feature of the present invention is the ability to provide relatively simple digital correction of the measured time count. This implies both low cost of digital computations and of either control of or estimation of parameters that determine the exact piece-wise non-linear analog reference waveform.

DESCRIPTION—DIGITAL CORRECTION OF THE MEASURED TIME

Consider a sinusoidal waveform y(t) which is a function of time, as shown in equation (1).

$$y(t)=A\cos(\omega t+\phi)+\epsilon \qquad (1)$$

In equation (1), A is the amplitude of the sinusoid, $\omega$ is the frequency, $\phi$ is the phase, and $\epsilon$ is a level offset. Suppose that y(t) is compared to an unknown analog input $Y_{in}$ during one half-period of the sinusoid while a digital clock keeps track of elapsed time. Furthermore, suppose that the comparator has an input offset voltage of $\delta$.

The value of y(t) begins at $A\cos(\phi)$ and ends at $A\cos(\pi+\phi)$. Supposing that $\phi$ is small enough and that A is large enough for $y_{in}+\delta$ to be less than $A\cos(\phi)$ and greater $A\cos(\pi+\phi)$, the measured time $t_{in}$ is recorded when $y_{in}+\delta=A\cos(\omega t+\phi)+\epsilon$. In other words, $t_{in}$ is related to $y_{in}$ according to equation (2).

$$t_{in}\cong(1/\omega)(\cos^{-1}((y_{in}\delta-\epsilon)/A)-\phi) \qquad (2)$$

Note that in equation (2), the equality is only approximate. The measured time is a digital number value which may have a precision defined in terms of bits. A low-precision value can use a relatively slow counter with a suitable small number of bits, while a high-precision value merely requires a relatively fast counter with a suitable large number of bits.

Assuming that $\omega$ and $\phi$ are known precisely, multiplying the measured time $t_{in}$ by $\omega$, adding $\phi$ to the result, and computing the cosine of the sum result in the approximation of equation (3).

$$\cos(\omega t_{in}+\phi)\cong(y_{in}+\delta-\epsilon)/A. \qquad (3)$$

The digital computations on the left-hand side are likely to be dominated in cost by the trigonometric function calculation. However, techniques for calculating trigonometric functions are well-known in the prior art, and techniques for digital computation become faster and less costly with technological improvements such as smaller integrated-circuit feature sizes. A useful value of $\phi$, if it is controlled, is zero. However, if $\phi$ is not controlled, it may be estimated.

With respect to the right hand side of equation (3), all four components may be unknown. The term $\delta-\epsilon$ includes the effects of a comparator input offset voltage unique to a given comparator and a possible offset in the sinusoid itself, while the amplitude A may or may not be known or precisely controlled.

However, suppose that a first known signal $y_1$ is applied to the comparator with exactly the same input configuration used to measure $t_{in}$ and that a corresponding $t_1$ is measured. Then, $\cos(\omega t_1+\phi)\cong(y_1+\delta-\epsilon)/A$. Subtracting this result from equation (3) produces the following result:

$$\cos(\omega t_{in}+\phi)-\cos(\omega t_1+\phi)\cong(y_{in}-y_1)/A. \qquad (4)$$

Equation (4) is similar to existing techniques for correcting the effects of comparator input offset voltage. Note that there is no need to estimate either $\delta$ or $\epsilon$, provided that their difference is the same during the measurements of $t_{in}$ and $t_1$.

On the right hand side of equation (4), the value of A remains. As mentioned above, A may not be known with great precision. However, it can be eliminated by normalizing with respect to a pair of known input signals. Consider a known input $y_2$ with a corresponding measured time $t_2$ and a different known input $y_3$ with a different measured time $t_3$. Applying the same multiplication, addition, and cosine computations as above, $$\cos(\omega t_2+\phi)-\cos(\omega t_3+\phi)\cong(y_2-y_3)/A. \qquad (5)$$

The results of equations (4) and (5) can be combined.

$$((y_{in}-y_1)/A)/((y_2-y_3)/A)=(y_{in}-y_1)/(y_2-y_3) \qquad (6)$$

The right hand side of equation (6) represents a normalized measurement that is free of offset and scale errors. To obtain a desired range of actual values, it can be multiplied by a desired scaling factor.

Equation (4) and (5) combined as shown in equation (6) are similar to the suggestion in National Semiconductor Application Note 260 for normalization. In that prior art, a single reference signal and comparator were used, with conversion of a first reference signal, an unknown signal, and a second reference signal in succession. This would correspond to $y_3$ being the same as $y_1$, with measurements of $t_{in}$, $t_1$, and $t_2$ using the same sinusoid and comparator. However, it is important to note that the offset errors are functions of both the analog reference signal and the comparator which triggers count recording, while scale errors are only functions of the analog reference signal. The subtraction in equations (4) and (5) cancels the effects of offset errors, while the division implicit in equation (6) cancels the scaling error.

The basic requirements for proper correction per equation (6) are measurement of $t_{in}$ and $t_1$ using the same reference waveform, a first comparator, and a first common input configuration, and measurement of $t_2$ and $t_3$ using the same reference waveform and a second comparator and a second common input configuration which are not necessarily the same as the first comparator and the first common input configuration. Measurements of reference times corresponding to known analog inputs which are used for scale correction can be shared among parallel converters which themselves share the same analog reference waveform.

DESCRIPTION—ALTERNATIVE EMBODIMENTS

There are many useful alternative embodiments of the present invention. As mentioned above, shared parallel A/D converters are useful. In alternative embodiments of the invention, a multiplicity of A/D converters can share one or more of a piece-wise non-linear analog reference waveform, a counter, digital correction circuitry, or scale correction measurements. The only dedicated components actually required by the different A/D converters are the comparators and the recording means, as well as any circuitry required to sample and hold (S/H) an analog input. However, comparators, digital registers, and S/H circuits can be designed once as a standard-cell circuit block and replicated as desired.

Parallel A/D converters allow an increase in the total number of conversions per unit time without a substantial increase in the time required for an individual conversion. Thus, a low-frequency analog reference waveform can be used in conjunction with S/H and multiplexing circuitry to implement high-rate A/D converters embodying the present invention. This may be particularly desirable if piece-wise non-linear analog reference waveform generators such as sinusoid generators are easily and precisely controlled frequency and phase characteristics only over a limited range of frequencies. Shared parallel embodiments of the invention can achieve higher throughput at reasonable cost.

As mentioned earlier, sinusoids are used for demodulation in the receivers of communications systems. A sinusoid used for frequency down-shifting in a communications receiver could also be used as a piece-wise non-linear reference waveform in an A/D converter for a down-shifted received signal. Similarly, in a transceiver—a communications device that both transmits and receives—a sinusoid used for frequency up-shifting of a transmitted signal could be used as a piece-wise non-linear reference waveform in an A/D converter for a down-shifted received signal. Such sharing of the reference waveform might also be used in active (transmit-and-receive) or passive (receive-only) devices used in ultrasound, radar, infrared, or sonar signal processing. In these non-communications applications, analog signals are processed to form digital images.

The preferred embodiment of the invention suggested a linear mapping between analog input values and corrected count values. However, other mappings are possible. In alternative embodiments of the invention, the simple expedient of computing a non-linear function of a linear-mapped corrected count value can produce desired non-linear mappings.

It has long been recognized that non-linear quantization of speech samples can result in improved characteristics of reconstructed signals. Telephone systems have long used a technique called "companding" to implement this non-linear quantization. The basic form of companding is an analog non-linear compressor which is applied to a speech signal, with the analog compressor output converted to a digital number using an A/D converter implementing a linear analog-to-digital mapping. The present invention could be applied to transform a sinusoidal (or other piece-wise non-linear) mapping into a non-linear companded mapping. Rather than being analog, the non-linear compressor would be entirely digital.

Note also that correction of measured digital counts can implement an alternative mapping, but cannot introduce any new information. This means that, for instance, the precision of a computed linear mapping depends on the counter speed and on the time-varying properties of non-linear reference waveform segments. The bin size of a uniform linear mapping is must be greater than or equal to the largest change in the non-linear reference waveform during a single count interval. However, as high-speed multi-bit counters are easy to design and implement, the possible reduction in precision of the corrected digital counts relative to the measured digital counts should not be too great an obstacle to implementation of high-speed, high-precision A/D converters embodying the present invention.

CONCLUSION, RAMIFICATIONS, AND SCOPE

The reader will see that the present invention has several advantages over prior art techniques for, A/D conversion. In the present invention, segments of a piece-wise non-linear reference waveform are compared to A/D converter inputs. Digital times recorded as a result of the,comparison represent non-linear mappings of analog input values. However, when the non-linear mappings can be easily parametrized-as is the case with sinusoids, whose generation and use are well-developed for a wide variety of other applications-it is possible to estimate a digital representation of the original analog input. This estimate can then be digitally modified to represent a desired linear or non-linear mapping of analog input values.

Using the present invention, it is possible to implement low-cost, high-precision, high-speed A/D converters. The present invention eliminates the difficulties and limitations of high-speed generation of highly-linear ramp segments that are required for high-precision prior art A/D converters based on integrating capacitors. It is possible to share costs among parallel converters according to the present invention, particularly the costs of generating a piece-wise non-linear analog reference waveform, of counting time, and of correcting or transforming the measured count values in accordance with desired mappings.

The invention can be used in applications which already use sinusoidal reference signals, such as communications systems and imaging systems where transmitted, received, or transmitted and received signals are frequency-shifted using mixers. The invention can also be used in relatively low-rate applications such as speech processing and in relatively high-rate applications such as high-resolution, high-precision digital image or digital video acquisition.

The description above contains many specific details relating to A/D conversion techniques, precision, speed, rate, conversion times, frequencies, phases, circuit design, sample and hold circuits, multiplexing circuits, comparators, counters, piece-wise non-linear analog reference waveforms, parameter estimation, error correction, shared components, and applications. These should not be construed as limiting the scope of the present invention, but as illustrating some of the presently preferred embodiments of the invention. The scope of the invention should be determined by the appended claims and their legal equivalents, rather than by the examples given.

I claim:

1. A machine used in an analog-to-digital (A/D) converter, comprising:

a. a first analog input b. a first piece-wise non-linear analog reference waveform having a first piece-wise non-linear waveform segment during a first conversion cycle c. a first counter providing a first count sequence during said first conversion cycle d. means for comparing said first analog input to said first piece-wise non-linear waveform segment during said first conversion cycle, producing a first comparison result e. means for recording the value of a member of said first count sequence as a first recorded count value which during said first conversion cycle on the basis of said first comparison result f. means for digitally processing said first recorded count value to provide a first corrected count value on the basis of information about said first piece-wise non-linear waveform segment whereby, for instance, said first corrected count value could reflect a linear mapping between possible values of said first analog input and possible values of said first count sequence without having to generate a piece-wise linear analog reference waveform.

2. The machine of claim 1 in which said means for digitally processing said first recorded count value to provide said first corrected count value attempts to provide a piece-wise linear mapping between possible values of said analog input and possible values of said first corrected count value.

3. The machine of claim 1 in which said first piece-wise non-linear analog reference waveform is a sinusoid, whereby well-developed prior art means for generating sinusoids can supply said first piece-wise non-linear analog reference waveform.

4. The machine of claim 3 further including means for using said sinusoid to modulate or to demodulate a signal which is a communications signal or an imaging system signal, whereby said sinusoid can be used both for frequency shifting of said signal and for A/D conversion of said signal.

5. The machine of claim 3 further including means for generating said sinusoid.

6. The machine of claim 5 in which said means for generating said sinusoid includes a voltage-controlled oscillator, whereby the frequency of said sinusoid can be precisely controlled.

7. The machine of claim 5 in which said means for generating said sinusoid further includes a phase-locked loop, whereby the frequency and the phase of said sinusoid can be precisely controlled.

8. The machine of claim 1 further including means for estimating parameters of said first piece-wise non-linear analog reference waveform or of said first piece-wise non-linear waveform segment, whereby said information can be derived and used even if said parameters are initially unknown or time-varying.

9. The machine of claim 8 in which said means for estimating said parameters includes means for measuring of a first reference count value corresponding to a first known analog input.

10. The machine of claim 9 in which said means for estimating said parameters further includes:

a. means for measuring a second reference count value corresponding to a second known analog input b. means for digitally processing said first reference count value to provide a first corrected reference count value which is in accordance with a first linear mapping between analog input values and corrected digital count values c. means for digitally processing said second reference count value to provide a second corrected reference count value which is in accordance with said first linear mapping d. means for combining said first corrected reference count value and said second corrected reference count value whereby said first known analog input and said second known analog input can have different values and the same input configurations, or the same value but different input configurations, or different values and different input configurations, and can be used in estimating said parameters.

11. The machine of claim 1 further including means for correcting the effects of reference waveform level offset and comparator input offset voltage.

12. The machine of claim 11 in which said first corrected count value is in accordance with a linear mapping between analog input values and corrected digital count values and in which said means for correcting the effects of reference waveform level offset and comparator input offset voltage comprises:

a. means for measuring of a first reference time count corresponding to a first known analog input, said means for measuring of said first reference time count employing said means for comparing which produced said first comparison result with the same input configuration b. means for digitally processing said first reference time value to provide a first corrected reference count value which is in accordance with said first linear mapping c. means for subtracting said first corrected reference count value from said first corrected count value to produce a first difference term whereby with the same input configuration, said first corrected count value and said first corrected reference count value include the same error due to waveform level offset and comparator input offset voltage, so that this error is largely absent in said first difference term.

13. The machine of claim 1 further including means for correcting the effects of reference waveform level offset and comparator input offset voltage and also for correcting the effects of unknown or poorly-estimated gain.

14. The machine of claim 13 in which said first corrected count value is in accordance with a linear mapping between analog input values and corrected digital count values and in which said means for correcting the effects of reference waveform level offset and comparator input offset voltage and also for correcting the effects of unknown or poorly-estimated gain comprises:

a. means for measuring of a first reference time count corresponding to a first known analog input, in which said means for measuring of said first reference time count employs said means for comparing which produced said first comparison result, with the same input configuration b. means for measuring of a second reference time count corresponding to a second known analog input, in which:
   i. said second known analog input does not have the same value as first known analog input
   ii. said means for measuring of said second reference time count employing said means for comparing which produced said first comparison result, with the same input configuration c. means for digitally processing said first reference time value to provide a first corrected reference count value which is in accordance with said first linear mapping d. means for digitally processing said second reference time value to provide a second corrected reference count value which is in accordance with said first linear mapping e. means for subtracting said first corrected reference count value from said first corrected count value to produce a first difference term f. means for subtracting said first corrected reference count value from said second corrected reference count value to produce a second difference term g. means for computing a first normalized corrected count value substantially equal to the product of said first difference term and a scaling factor divided by said second difference term whereby with the same input configuration, said first corrected count value, said first corrected reference count value, and said second corrected reference count value include the same error due to waveform level offset and comparator input offset voltage and the same scale error, and whereby said first normalized corrected count value substantially eliminates these errors and provides a desired scale.

15. The machine of claim 13 in which said first corrected count value is in accordance with a linear mapping between analog input values and corrected digital count values and in which said means for correcting the effects of reference waveform level offset and comparator input offset voltage comprises and also for correcting the effects of unknown or poorly-estimated gain comprises:

a. means for measuring of a first reference time count corresponding to a first known analog input, in which said means for measuring of said first reference time count employs said means for comparing which produced said first comparison result, with the same input configuration
   b. means for measuring of a second reference time count corresponding to a second known analog input, in which said means for measuring of said second reference time count employs means for comparing other than said means for comparing which produced said first comparison result, with a first input configuration
   c. means for measuring of a third reference time count corresponding to a third known analog input, in which:
      i. said third known analog input does not have the same value as second known analog input
      ii. said means for measuring of said third reference time count employing said means for comparing which resulted in said second reference time count, with the same input configuration, namely, said first input configuration
   d. means for digitally processing said first reference time value to provide a first corrected reference count value which is in accordance with said first linear mapping
   e. means for digitally processing said second reference time value to provide a second corrected reference count value which is in accordance with said first linear mapping
   f. means for digitally processing said third reference time value to provide a third corrected reference count value which is in accordance with said first linear mapping
   g. means for subtracting said first corrected reference count value from said first corrected count value to produce a first difference term
   h. means for subtracting said third corrected reference count value from said second corrected reference count value to produce a second difference term
   i. means for computing a first normalized corrected count value substantially equal to the product of said first difference term and a scaling factor divided by said second difference term whereby with the same input configuration and comparing means said first corrected count value and said first corrected reference count value include a first error due to level offset and comparator input offset voltage, whereby with the same input configuration and comparing means said second corrected reference count value and said third corrected reference count value include a second error due to level offset and comparator input offset voltage, said second error not necessarily being the same as said first error, whereby each corrected count error includes the same scale error due to unknown or poorly-estimated gain provided the same reference waveform, and whereby said first normalized corrected count value substantially eliminates these errors and provides a desired scale, without requiring that all of the count measurements use the same comparing means.

16. The machine of claim 15 in which said first known analog input has the same value as said third known analog input, whereby only two different known analog inputs are used.

17. The machine of claim 1 in which said piece-wise non-linear analog reference waveform has a second piece-wise non-linear waveform segment during a second conversion cycle, further including:

a. a second analog input
   b. a second count sequence provided during said second conversion cycle
   c. means for comparing said second analog input to said second piece-wise non-linear waveform segment during said second conversion cycle, producing a second comparison result
   d. means for recording the value of a member of said second count sequence as a second recorded count value which during said second conversion cycle on the basis of said second comparison result
   e. means for digitally processing said second recorded count value to provide a second corrected count value on the basis of information about said second piece-wise non-linear waveform segment
   f. and in which:
      i. said first piece-wise non-linear waveform segment begins at a first value and ends at a second value, said second value being greater than said first value
      ii. said second piece-wise non-linear waveform segment begins at a third value and ends at a fourth value, said fourth value being less than said third value whereby said piece-wise non-linear analog reference waveform can have both generally increasing waveform segments and generally decreasing waveform segments used for comparison.

18. The machine of claim 1 in which a multiplicity of parallel A/D converters share one or more of the following elements:

a. said first piece-wise non-linear analog reference waveform
   b. said first counter
   c. said means for digitally processing recorded counts
   d. measurements of known analog inputs used to correct waveform scale errors whereby the overall implementation cost can be greatly reduced relatively to parallel A/D converters which do not share components, and whereby it is possible to increase the total number of conversions per unit time without increasing the speed of any given conversion.

19. A method used in analog-to-digital (A/D) conversion, comprising:

a. comparing a first analog input to a first piece-wise non-linear analog reference waveform segment of a first piece-wise non-linear analog reference waveform during a first conversion cycle, producing a first comparison result
   b. recording the value of a member of a first count sequence provided during said first conversion cycle as a first recorded count value, on the basis of said first comparison result c. digitally processing said first recorded count value to provide a first corrected count value on the basis of information about said first piecewise non-linear waveform segment whereby, for instance, said first corrected count value could reflect a linear mapping between possible values of said first analog input and possible values of said first count sequence without having to generate a piece-wise linear analog reference waveform.

20. The method of claim 19 in which digitally processing said first recorded count value to provide said first corrected count value results in a piece-wise linear mapping between possible values of said analog input and possible values of said first corrected count value.

21. The method of claim 19 in which said first piece-wise non-linear analog reference waveform is a sinusoid, whereby well-developed prior art means for generating sinusoids can supply said first piece-wise non-linear analog reference waveform.

22. The method of claim 21 further including use of said sinusoid to modulate or to demodulate a signal which is a communications signal or an imaging system signal, whereby said sinusoid can be used both for frequency shifting of said signal and for A/D conversion of said signal.

23. The method of claim 21 further including generation of said sinusoid.

24. The method of claim 23 in which generation of said sinusoid comprises use of a voltage-controlled oscillator, whereby the frequency of said sinusoid can be precisely controlled.

25. The method of claim 23 in which generation of said sinusoid comprises use of a phase-locked loop, whereby the frequency and the phase of said sinusoid can be precisely controlled.

26. The method of claim 19 further including estimation of parameters of said first piece-wise non-linear analog reference waveform or of said first piecewise non-linear waveform segment, whereby said information can be derived and used even if said parameters are initially unknown or time-varying.

27. The method of claim 26 in which estimation of said parameters comprises measuring of a first reference count value corresponding to a first known analog input.

28. The method of claim 27 in which estimation of said parameters further includes:

a. measuring a second reference count value corresponding to a second known analog input b. digitally processing said first reference count value to provide a first corrected reference count value which is in accordance with a first linear mapping between analog input values and corrected digital count values c. digitally processing said second reference count value to provide a second corrected reference count value which is in accordance with said first linear mapping d. combining said first corrected reference count value and said second corrected reference count value whereby said first known analog input and said second known analog input can have different values and the same input configurations, or the same value but different input configurations, or different values and different input configurations, and can be used in estimating said parameters.

29. The method of claim 19 further including correction of the effects of reference waveform level offset and comparator input offset voltage.

30. The method of claim 29 in which said first corrected count value is in accordance with a linear mapping between analog input values and corrected digital count values and in which correcting of said effects of reference waveform level offset and comparator input offset voltage comprises:

a. measuring of a first reference time count corresponding to a first known analog input, said measuring of said first reference time count employing the method of said comparing which produced said first comparison result, with the same input configuration b. digitally processing said first reference time value to provide a first corrected reference count value which is in accordance with said first linear mapping c. subtracting said first corrected reference count value from said first corrected count value to produce a first difference term whereby with the same input configuration, said first corrected count value and said first corrected reference count value include the same error due to waveform level offset and comparator input offset voltage, so that this error is largely absent in said first difference term.

31. The method of claim 19 further including correction of the effects of reference waveform level offset and comparator input offset voltage and also for corrections of the effects of unknown or poorly-estimated gain.

32. The method of claim 31 in which said first corrected count value is in accordance with a linear mapping between analog input values and corrected digital count values and in which correcting of said effects of reference waveform level offset and comparator input offset voltage and correcting the effects of unknown or poorly-estimated gain comprises:

a. measuring of a first reference time count corresponding to a first known analog input, in which said measuring of said first reference time count employs the same method as said comparing which produced said first comparison result, with the same input configuration b. measuring of a second reference time count corresponding to a second known analog input, in which:
    i. said second known analog input does not have the same value as first known analog input
    ii. said measuring of said second reference time count employs the method of said comparing which produced said first comparison result, with the same input configuration c. digitally processing said first reference time value to provide a first corrected reference count value which is in accordance with said first linear mapping d. digitally processing said second reference time value to provide a second corrected reference count value which is in accordance with said first linear mapping e. subtracting said first corrected reference count value from said first corrected count value to produce a first difference term f. subtracting said first corrected reference count value from said second corrected reference count value to produce a second difference term g. computing a first normalized corrected count value substantially equal to the product of said first difference term and a scaling factor divided by said second difference term whereby with the same input configuration, said first corrected count value, said first corrected reference count value, and said second corrected reference count value include the same error due to waveform level offset and comparator input offset voltage and the same scale error, and whereby said first normalized corrected count value substantially eliminates these errors and provides a desired scale.

33. The method of claim 31 in which said first corrected count value is in accordance with a linear mapping between analog input values and corrected digital count values and in which correcting of said effects of reference waveform level offset and comparator input offset voltage and also correcting of said effects of unknown or poorly-estimated gain comprises:
   a. measuring of a first reference time count corresponding to a first known analog input, in which said measuring of said first reference time count employs the same method as said comparing which produced said first comparison result, with the same input configuration
   b. measuring of a second reference time count corresponding to a second known analog input, in which said measuring of said second reference time count employs a method for comparing other than said method for comparing which produced said first comparison result, with a first input configuration
   c. measuring of a third reference time count corresponding to a third known analog input, in which:
      i. said third known analog input does not have the same value as second known analog input
      ii. said measuring of said third reference time count employing the same method as said comparing which resulted in said second reference time count, with the same input configuration, namely, said first input configuration
   d. digitally processing said first reference time value to provide a first corrected reference count value which is in accordance with said first linear mapping
   e. digitally processing said second reference time value to provide a second corrected reference count value which is in accordance with said first linear mapping
   f. digitally processing said third reference time value to provide a third corrected reference count value which is in accordance with said first linear mapping
   g. subtracting said first corrected reference count value from said first corrected count value to produce a first difference term
   h. subtracting said third corrected reference count value from said second corrected reference count value to produce a second difference term
   i. computing a first normalized corrected count value substantially equal to the product of said first difference term and a scaling factor divided by said second difference term whereby with the same input configuration and comparing methods said first corrected count value and said first corrected reference count value include a first error due to level offset and comparator input offset voltage, whereby with the same input configuration and comparing methods said second corrected reference count value and said third corrected reference count value include a second error due to level offset and comparator input offset voltage, said second error not necessarily being the same as said first error, whereby each corrected count error includes the same scale error due to unknown or poorly-estimated gain provided the same reference waveform, and whereby said first normalized corrected count value substantially eliminates these errors and provides a desired scale, without requiring that all of the count measurements use the same comparing methods.

34. The method of claim 33 in which said first known analog input has the same value as said third known analog input, whereby only two different known analog inputs are used.

35. The method of claim 19 in which said piece-wise non-linear analog reference waveform has a second piece-wise non-linear waveform segment during a second conversion cycle, further including:
   a. comparing a second analog input to said second piece-wise non-linear waveform segment during said second conversion cycle, producing a second comparison result
   b. recording the value of a member of a second count sequence as a second recorded count value which during said second conversion cycle on the basis of said second comparison result
   c. digitally processing said second recorded count value to provide a second corrected count value on the basis of information about said second piecewise non-linear waveform segment
   d. and in which:
      i. said first piece-wise non-linear waveform segment begins at a first value and ends at a second value, said second value being greater than said first value
      ii. said second piece-wise non-linear waveform segment begins at a third value and ends at a fourth value, said fourth value being less than said third value whereby said piece-wise non-linear analog reference waveform can have both generally increasing waveform segments and generally decreasing waveform segments used for comparison.

36. The method of claim 19 in which a multiplicity of parallel A/D conversions share one or more of the following elements:
   a. said first piece-wise non-linear analog reference waveform
   b. said first counter
   c. said method for digitally processing recorded counts
   d. measurements of known analog inputs used to correct waveform scale errors whereby the overall implementation cost can be greatly reduced relatively to parallel A/D converters which do not share components, and whereby it is possible to increase the total number of conversions per unit time without increasing the speed of any given conversion.

* * * * *